(12) United States Patent
Karalkar et al.

(10) Patent No.: US 12,727,256 B2
(45) Date of Patent: Sep. 1, 2026

(54) STRUCTURES FOR AN ELECTROSTATIC DISCHARGE PROTECTION DEVICE

(71) Applicant: GlobalFoundries U.S. Inc., Malta, NY (US)

(72) Inventors: Sagar Premnath Karalkar, Essex Junction, VT (US); Vishal Ganesan, Dresden (DE); Kyong Jin Hwang, Singapore (SG); Souvick Mitra, Essex Junction, VT (US)

(73) Assignee: GlobalFoundries U.S. Inc., Malta, NY (US)

( * ) Notice: Subject to any disclaimer, the term of this patent is extended or adjusted under 35 U.S.C. 154(b) by 424 days.

(21) Appl. No.: 18/213,442

(22) Filed: Jun. 23, 2023

(65) Prior Publication Data

US 2024/0429227 A1 Dec. 26, 2024

(51) Int. Cl.
*H10D 89/60* (2025.01)

(52) U.S. Cl.
CPC ................................ *H10D 89/814* (2025.01)

(58) Field of Classification Search
CPC ........................... H10D 89/814; H10D 89/815
See application file for complete search history.

(56) References Cited

U.S. PATENT DOCUMENTS 6,207,484 B1 * 3/2001 Kim .................... H10D 62/371 438/298
9,607,980 B1 * 3/2017 Wang ................ H10D 30/0281
10,366,975 B1 * 7/2019 Zeng ...................... H02H 9/046
2002/0050619 A1 * 5/2002 Kawaguchi ........ H10D 30/0221 257/E27.06
2008/0061400 A1 * 3/2008 Williams .............. H01L 21/761 257/E29.054
2013/0049112 A1 * 2/2013 Lai ...................... H10D 62/108 257/E29.256

(Continued)

FOREIGN PATENT DOCUMENTS

KR 20070000706 A 1/2007
KR 101944189 B1 4/2019

OTHER PUBLICATIONS

W.-Y. Chen and M. -D. Ker, "New Layout Arrangement to Improve ESD Robustness of Large-Array High-Voltage LDMOS," in IEEE Electron Device Letters, vol. 31, No. 2, pp. 159-161, Feb. 2010, doi: 10.1109/LED.2009.2037343.

(Continued)

*Primary Examiner* — Bitew A Dinke
(74) *Attorney, Agent, or Firm* — Thompson Hine LLP; Francois Pagette

(57) ABSTRACT

Structures for an electrostatic discharge protection device and methods of forming same. The structure comprises adjacent first and second gates over a semiconductor substrate, a source adjacent to the first gate, and a drain adjacent to the second gate. The source includes a first well in the semiconductor substrate, a second well in the semiconductor substrate, and a doped region. The first well and the doped region have a first conductivity type, and the second well has a second conductivity type opposite from the first conductivity type. The doped region has a first portion that overlaps with the first well, and the doped region has a second portion that overlaps with the second well.

20 Claims, 6 Drawing Sheets

(56) References Cited

U.S. PATENT DOCUMENTS

| | | | | |
|---|---|---|---|---|
| 2014/0197491 | A1* | 7/2014 | Yamaji | H10D 30/603 438/297 |
| 2015/0069508 | A1* | 3/2015 | Ko | H10D 62/153 257/343 |
| 2015/0263085 | A1* | 9/2015 | Lee | H10D 62/106 438/286 |
| 2015/0380398 | A1* | 12/2015 | Mallikarjunaswamy | H10D 84/82 257/272 |
| 2016/0027773 | A1* | 1/2016 | Chen | H10D 89/814 257/337 |
| 2016/0240660 | A1* | 8/2016 | Yue | H10D 62/107 |
| 2018/0233555 | A1* | 8/2018 | Kim | H10D 64/111 |
| 2018/0323184 | A1* | 11/2018 | Hung | H10D 89/711 |
| 2020/0044080 | A1* | 2/2020 | Sheu | H10D 30/0285 |
| 2021/0167205 | A1* | 6/2021 | Wang | H10D 84/0151 |
| 2021/0175226 | A1* | 6/2021 | Song | H10D 89/814 |
| 2024/0395796 | A1* | 11/2024 | Yuki | H10D 84/00 |

OTHER PUBLICATIONS

J. Zeng, S. Dong, J. J. Liou, Y. Han, L. Zhong and W. Wang, "Design and Analysis of an Area-Efficient High Holding Voltage ESD Protection Device," in IEEE Transactions on Electron Devices, vol. 62, No. 2, pp. 606-614, Feb. 2015, doi: 10.1109/TED.2014.2381511.

Seo, Yong-Jin & Kim, Kil-Ho. (2007). Characteristics of an Extended Drain N-Type MOS Device for Electrostatic Discharge Protection of a LCD Driver Chip Operating at High Voltage.: Journal of The Korean Physical Society—J Korean Phys Soc. 50. 10.3938/jkps.50.897.

S. P. Karalkar, V. Ganesan, M. Paul, K. Hwang and R. Gauthier, "Design Optimization of MV-NMOS to Improve Holding Voltage of a 28nm CMOS Technology ESD Power Clamp," 2021 IEEE International Reliability Physics Symposium (IRPS), Monterey, CA, USA, 2021, pp. 1-5, doi: 10.1109/IRPS46558.2021.9405206.

Sagar Premnath Karalkar et al., "Silicon-Controlled Rectifiers for an Electrostatic Discharge Protection Device" filed on May 5, 2022 as a U.S. Appl. No. 17/737,272.

* cited by examiner 16
42
22
36
18
46
30
50
26
48
52
56
40
14
50
48
34
25
32
44
24
20
28
38
12
10

STRUCTURES FOR AN ELECTROSTATIC DISCHARGE PROTECTION DEVICE

BACKGROUND

The disclosure relates generally to semiconductor devices and integrated circuit fabrication and, more specifically, to structures for an electrostatic discharge protection device and methods of forming same.

An integrated circuit may be exposed to random electrostatic discharge (ESD) events that can direct potentially large and damaging ESD currents to the sensitive devices of the integrated circuit. An ESD event refers to an unpredictable electrical discharge over a short duration and during which a large positive or negative current is directed toward the integrated circuit. ESD events may occur during post-manufacture chip handling or after chip installation on a circuit board or other carrier. ESD events may originate from a variety of sources, such as the human body, a machine component, or a chip carrier.

Precautions may be taken to protect an integrated circuit from an ESD event. One such precaution consists of an on-chip protection circuit that is designed to avert damage to the sensitive devices of the integrated circuit during an ESD event. If an ESD event occurs, the protection circuit triggers a protection device to enter a low-impedance state that conducts the ESD current to ground and thereby shunts the ESD current away from the sensitive devices of the integrated circuit. The protection device remains clamped in its low-impedance state until the ESD current is drained and the ESD voltage is discharged to an acceptable level.

Improved structures for an electrostatic discharge protection device and methods of forming same are needed.

SUMMARY

In an embodiment, a structure for an electrostatic discharge protection device is provided. The structure comprises a first gate and a second gate over a semiconductor substrate, a source adjacent to the first gate, and a drain adjacent to the second gate. The second gate is adjacent to the first gate. The source includes a first well in the semiconductor substrate, a second well in the semiconductor substrate, and a doped region. The first well and the doped region have a first conductivity type, and the second well has a second conductivity type opposite from the first conductivity type. The doped region has a first portion overlaps with the first well, and the doped region has a second portion that overlaps with the second well.

In an embodiment, a method of forming a structure for an electrostatic discharge protection device is provided. The method comprises forming a first gate and a second gate over a semiconductor substrate. The second gate is disposed adjacent to the first gate. The method further comprises forming a source adjacent to the first gate and forming a drain adjacent to the second gate. The source includes a first well in the semiconductor substrate, a second well in the semiconductor substrate, and a doped region. The first well and the doped region have a first conductivity type, and the second well has a second conductivity type opposite from the first conductivity type. The doped region has a first portion that overlaps with the first well, and the doped region has a second portion that overlaps with the second well.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals are used to indicate like features in the various views.

DETAILED DESCRIPTION

Figure 1:
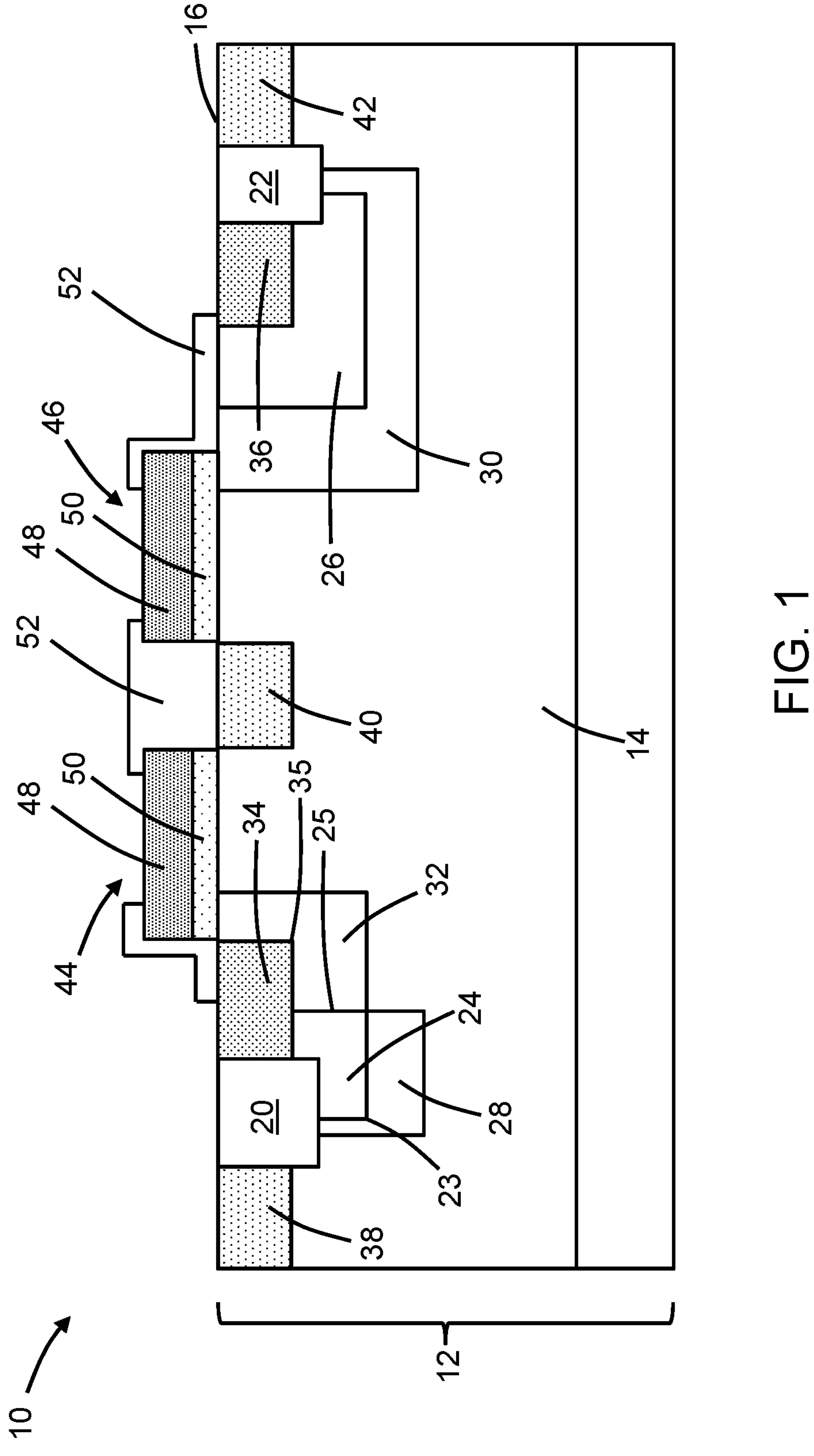
FIG. 1 is a cross-sectional view of a structure in accordance with embodiments of the invention.

With reference to FIG. 1 and in accordance with embodiments of the invention, a device structure 10 for an electrostatic discharge protection device includes a semiconductor substrate 12, a high-voltage well 14 in the semiconductor substrate 12, and shallow trench isolation regions 20, 22 in the semiconductor substrate 12. The semiconductor substrate 12 may be comprised of a semiconductor material, such as single-crystal silicon. In an embodiment, the high-voltage well 14 may be lightly doped with a concentration of a p-type dopant (e.g., boron) such that the high-voltage well 14 has p-type conductivity. In an embodiment, the high-voltage well 14 may be formed by introducing a dopant by, for example, a masked ion implantation into the semiconductor substrate 12. The implantation conditions (e.g., ion species, dose, kinetic energy) may be selected to tune the electrical and physical characteristics of the high-voltage well 14. The shallow trench isolation regions 20, 22 may be formed by patterning shallow trenches in the semiconductor substrate 12 with lithography and etching processes, depositing a dielectric material, such as silicon dioxide, in the shallow trenches, and recessing and/or planarizing the deposited dielectric material.

Wells 24, 26 may be formed in respective portions of the semiconductor substrate 12, and wells 28, 30 may also be formed in respective portions of the semiconductor substrate 12. The well 24 adjoins the well 28, and the well 26 adjoins the well 30. More specifically, the well 26 is adjoined on multiple sides by the well 30, and the well 24 is adjoined on a lesser number of sides by the well 28. In an embodiment, the well 24 may have a corner 23 that is disposed beneath the shallow trench isolation region 20, and the well 28 may wrap around the corner 23 of the well 24 such that a portion of the well 28 is disposed below the well 24 and a portion of the well 28 is disposed adjacent to a side of the well 24. The well 24 and the well 28 may provide portions of the source of the electrostatic discharge protection device, and the well 26 and the well 30 may provide portions of the drain of the electrostatic discharge protection device.

In an embodiment, the wells 24, 26 may contain a concentration of an n-type dopant (e.g., arsenic or phosphorus) to provide n-type conductivity. The wells 24, 26 may be formed by selectively implanting ions, such as ions including the n-type dopant, with an implantation mask having openings defining the intended locations for the wells 24, 26 in the semiconductor substrate 12. The implantation conditions (e.g., ion species, dose, kinetic energy) may be selected to tune the electrical and physical characteristics of the wells 24, 26.

In an embodiment, the wells 28, 30 may contain a concentration of an n-type dopant (e.g., arsenic or phosphorus) to provide n-type conductivity. The wells 28, 30 may be formed by selectively implanting ions, such as ions including the n-type dopant, with an implantation mask having openings defining the intended locations for the wells 28, 30 in the semiconductor substrate 12. The implantation conditions (e.g., ion species, dose, kinetic energy) may be selected to tune the electrical and physical characteristics of the wells 28, 30. The wells 24, 26 may have a higher dopant concentration than the wells 28, 30. The wells 24, 26 and the wells 28, 30 have an opposite conductivity type from the high-voltage well 14.

A well 32 may be formed in a portion of the semiconductor substrate 12. The well 32 may include a portion that abuts the well 24, a portion that adjoins a top surface 16 of the semiconductor substrate 12, and a portion that abuts the high-voltage well 14. The well 32 may have an opposite conductivity type from the wells 24, 26 and an opposite conductivity type from the wells 28, 30. In an embodiment, the well 32 may be disposed over the same or substantially the same depth range in the semiconductor substrate 12 as the well 24. In an embodiment, the well 28 may be absent beneath the well 32, which permits a portion of the well 32 to abut the high-voltage well 14. The well 32 may provide a portion of the source of the electrostatic discharge protection device.

The well 32 may have the same conductivity type as the high-voltage well 14 but at a higher dopant concentration. In an embodiment, the well 32 may contain a concentration of a p-type dopant (e.g., boron) to provide p-type conductivity. The well 32 may be formed by selectively implanting ions, such as ions including the p-type dopant, with an implantation mask having an opening defining the intended location for the well 32 in the semiconductor substrate 12. The implantation conditions (e.g., ion species, dose, kinetic energy) may be selected to tune the electrical and physical characteristics of the well 32.

Doped regions 34, 36 are formed in respective portions of the semiconductor substrate 12. The doped region 34 includes a portion that abuts the well 24, a portion that abuts the shallow trench isolation region 20, and a portion that abuts the well 32, and the doped region 36 includes a portion that abuts the shallow trench isolation region 22 and a portion that abuts the well 26. The doped regions 34, 36 are positioned adjacent to the top surface 16 of the semiconductor substrate 12. The well 24 and the well 32 adjoin at an interface 25 across which the conductivity type changes, and the doped region 34 overlaps with the interface 25 such that the doped region 34 is disposed between the interface 25 and the top surface 16. The doped region 34 may provide a portion of the source of the electrostatic discharge protection device, and the doped region 36 may provide a portion of the drain of the electrostatic discharge protection device.

The doped region 34 may be doped to the same conductivity type as the well 24 but at a higher dopant concentration, the doped region 34 may be doped to have an opposite conductivity type from the well 32, and the doped region 36 may be doped to the same conductivity type as the well 26 but at a higher dopant concentration. In an embodiment, the doped regions 34, 36 may contain a concentration of an n-type dopant (e.g., arsenic or phosphorus) to provide n-type conductivity. The doped regions 34, 36 may be concurrently formed by selectively implanting ions, such as ions including the n-type dopant, with an implantation mask having openings defining the intended locations for the doped regions 34, 36 in the semiconductor substrate 12. The implantation conditions (e.g., ion species, dose, kinetic energy) may be selected to tune the electrical and physical characteristics of the doped regions 34, 36.

A doped region 38 is disposed in a portion of the high-voltage well 14 adjacent to the source of the electrostatic discharge protection device, a doped region 40 is disposed in a portion of the high-voltage well 14 between the source and the drain of the electrostatic discharge protection device, and a doped region 42 is disposed in a portion of the high-voltage well 14 adjacent to the source of the electrostatic discharge protection device. The doped regions 38, 40, 42 may be doped to have the same conductivity type as the high-voltage well 14 but at a higher dopant concentration. In an embodiment, the doped regions 38, 40, 42 may contain a concentration of a p-type dopant (e.g., boron) to provide p-type conductivity. The doped regions 38, 40, 42 may be concurrently formed by selectively implanting ions, such as ions including the p-type dopant, with an implantation mask having openings defining the intended locations for the doped regions 38, 40, 42 in the semiconductor substrate 12. The implantation conditions (e.g., ion species, dose, kinetic energy) may be selected to tune the electrical and physical characteristics of the doped regions 38, 40, 42.

The doped regions 38, 40, 42 are positioned adjacent to the top surface 16 of the semiconductor substrate 12. The doped region 38 is disposed adjacent to the doped region 34, and the shallow trench isolation region 20 is positioned in a lateral direction between the doped region 34 and the doped region 38. The doped region 42 is disposed adjacent to the doped region 36, and the shallow trench isolation region 22 is positioned in a lateral direction between the doped region 36 and the doped region 42. The doped region 38 and the doped region 42 may provide body contacts to the high-voltage well 14.

Gates 44, 46 are formed on, and over, respective portions of the top surface 16 of the semiconductor substrate 12. The gates 44, 46 include a gate conductor layer 48 and a gate dielectric layer 50 that are formed in a layer stack with the gate dielectric layer 50 positioned between the gate conductor layer 48 and the top surface 16. In an embodiment, the gate conductor layers 48 may be comprised of a conductor, such as doped polysilicon, and the gate dielectric layers 50 may be comprised of a dielectric material, such as silicon dioxide. The gates 44, 46 may be present on the top surface 16 when the doped regions 34, 36 and the doped region 40 are formed and may contribute to self-alignment during their formation.

The gate 44 overlaps with a portion of the well 32 and a portion of the high-voltage well 14, and the gate 46 overlaps with a portion of the well 30 and a portion of the high-voltage well 14. The overlapped portion of the well 30 and the overlapped portion of the well 32 are characterized by opposite conductivity types. The doped region 40 is disposed in the high-voltage well 14 between the portion of the high-voltage well 14 overlapped by the gate 44 and the portion of the high-voltage well 14 overlapped by the gate 46. In an embodiment, the doped region 34 may have a corner 35, and the well 32 may wrap around the corner 35 of the doped region 34. A corner of the doped region 34 opposite from the corner 35 adjoins the shallow trench isolation region 20 and is disposed over the well 24.

The source of the electrostatic discharge protection device, which includes the well 24, the well 28, the well 32, and the doped region 34, is disposed in the high-voltage well 14. The drain of the electrostatic discharge protection device, which includes the well 26, the well 30, and doped region 36, is also disposed in the high-voltage well 14. The gates 44, 46 are both disposed in a lateral direction between the source and the drain.

A dielectric layer 52 comprised of a dielectric material, such as silicon nitride, may be deposited and then patterned by lithography and etching processes to define sections. The dielectric layer 52 includes a section that fully overlaps with the doped region 40 between the gates 44, 46. The dielectric layer 52 includes another section that overlaps with a portion of the doped region 34 and a portion of the gate 44, and another section that overlaps with a portion of the gate 46, a portion of the well 26, a portion of the well 30, and a portion of the doped region 36. The dielectric layer 52 may function as a silicide-blocking layer.

Figure 2:
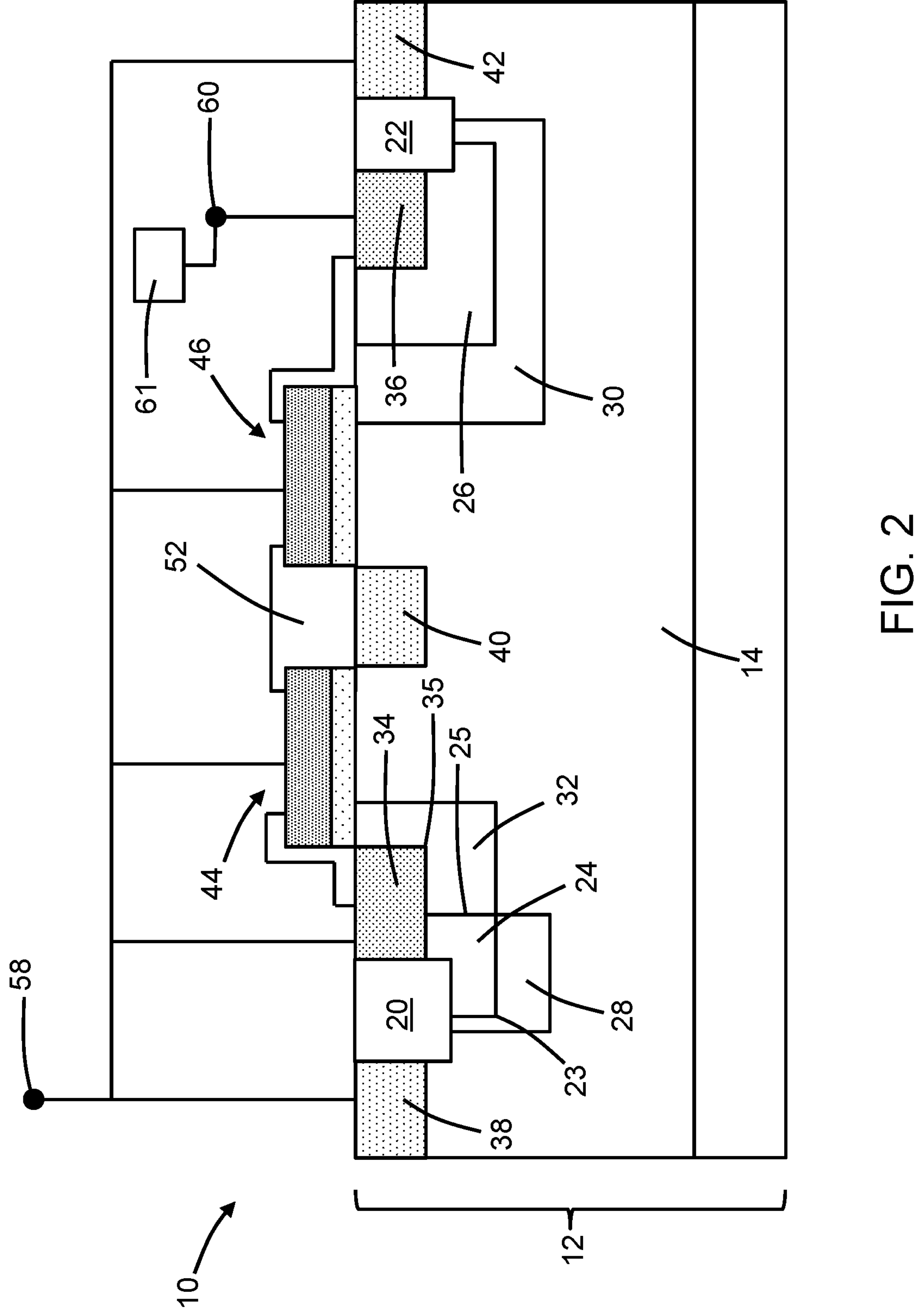
FIG. 2 is a cross-sectional view of the structure at a fabrication stage subsequent to FIG. 1.

With reference to FIG. 2 in which like reference numerals refer to like features in FIG. 1 and at a subsequent fabrication stage, the device structure 10 may include a terminal 58 and a terminal 60 that are coupled by respective electrical connections to the electrostatic discharge protection device. The terminal 58 is physically and electrically connected to the doped region 34 of the source, the gates 44, 46, the doped region 38, and the doped region 42. The terminal 60 is physically and electrically connected to the doped region 36 of the drain. In an embodiment, an input/output pad 61 may be coupled to the terminal 60. The electrical connections may include silicide layers formed at the top surface 16 on the doped regions 34, 36, the gates 44, 46, the doped region 38, and the doped region 42, and metal features of an interconnect structure that are disposed in one or more dielectric layers. The doped region 40 disposed between the gate 44 and the gate 46 is not coupled to an electrical connection and, for that reason, the doped region 40 is electrically floating in the electrostatic discharge protection device during operation. The section of the dielectric layer 52 between the gates 44, 46 blocks the formation of silicide on the doped region 40.

The electrical connections to the terminals 58, 60 may configure the device structure 10 to function as a grounded-gate n-type metal-oxide-semiconductor device (GGNMOS) that may be deployed as an electrostatic discharge protection device in an on-chip protection circuit. The terminal 58 may be connected to ground such that the doped region 34, the gates 44, 46, doped region 38, and the doped region 42 are tied to ground. The terminal 60 may connect the doped region 36 of the drain of the electrostatic discharge protection device to the input/output pad 61 that is under protection against an electrostatic discharge event.

The device structure 10 may improve electrostatic discharge protection for the input/output pad 61 connected to the terminal 60. The electrostatic discharge protection device embodied in the device structure 10 may be characterized by a high holding voltage, which may permit a reduction in the device footprint or area. The device structure 10 may be considered to be asymmetrical in that the source differs from the drain because, at least in part, the source of the electrostatic discharge protection device includes the oppositely-doped well 32 and the drain of the electrostatic discharge protection device lacks a similar oppositely-doped well.

Figure 3:
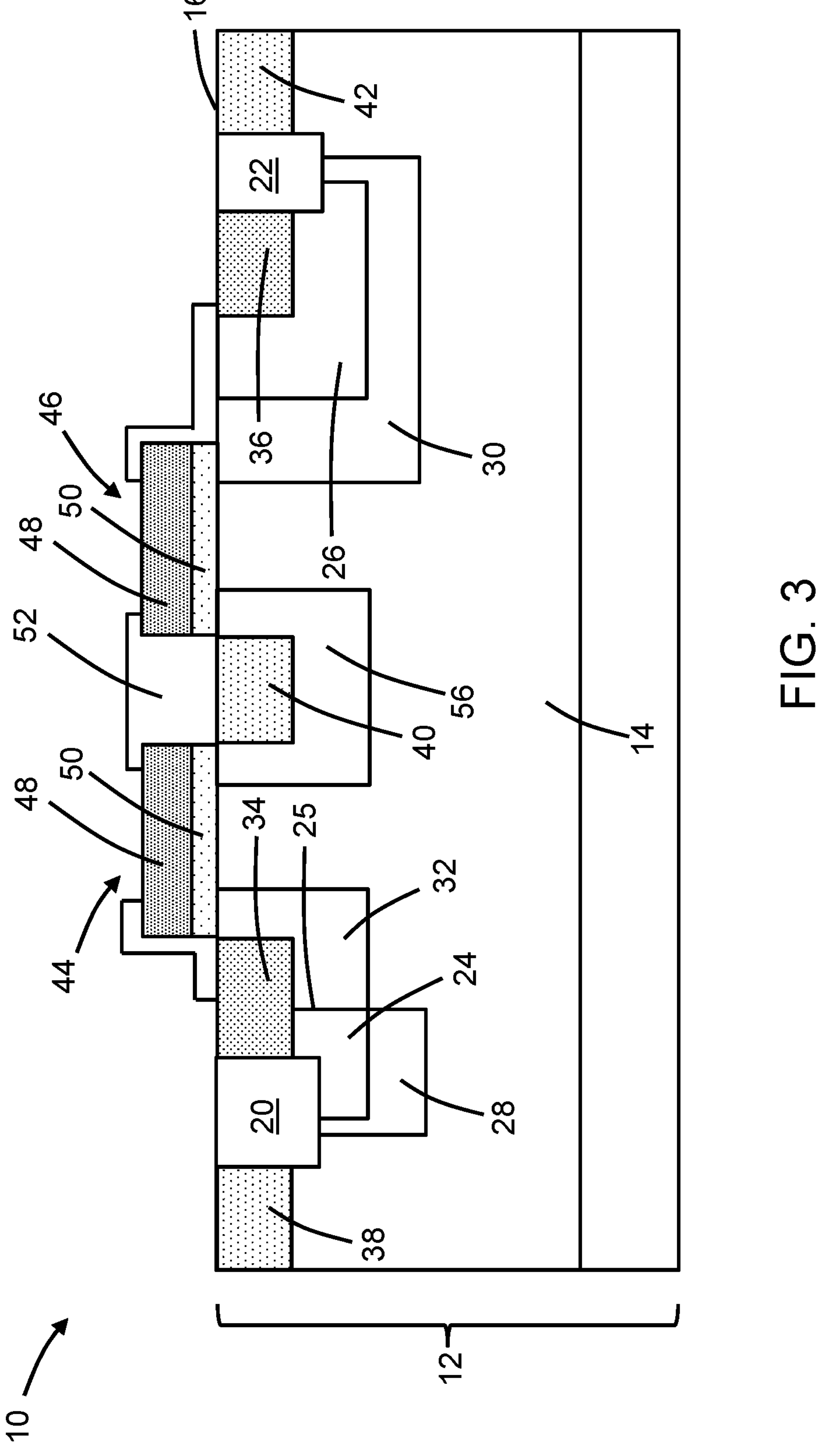
FIG. 3 is a cross-sectional view of a structure in accordance with alternative embodiments of the invention.

With reference to FIG. 3 in which like reference numerals refer to like features in FIG. 1 and in accordance with alternative embodiments of the invention, the device structure 10 may be modified to add a well 56 in the high-voltage well 14 that adjoins the doped region 40 on multiple sides. The well 56 may be doped to have the same conductivity type (e.g., p-type conductivity) as the high-voltage well 14 and the doped region 40 but at a dopant concentration that is greater than the dopant concentration of the high-voltage well 14 and that is less than the dopant concentration of the doped region 40. In an embodiment, the well 56 may be formed when the well 32 is formed.

Figure 4:
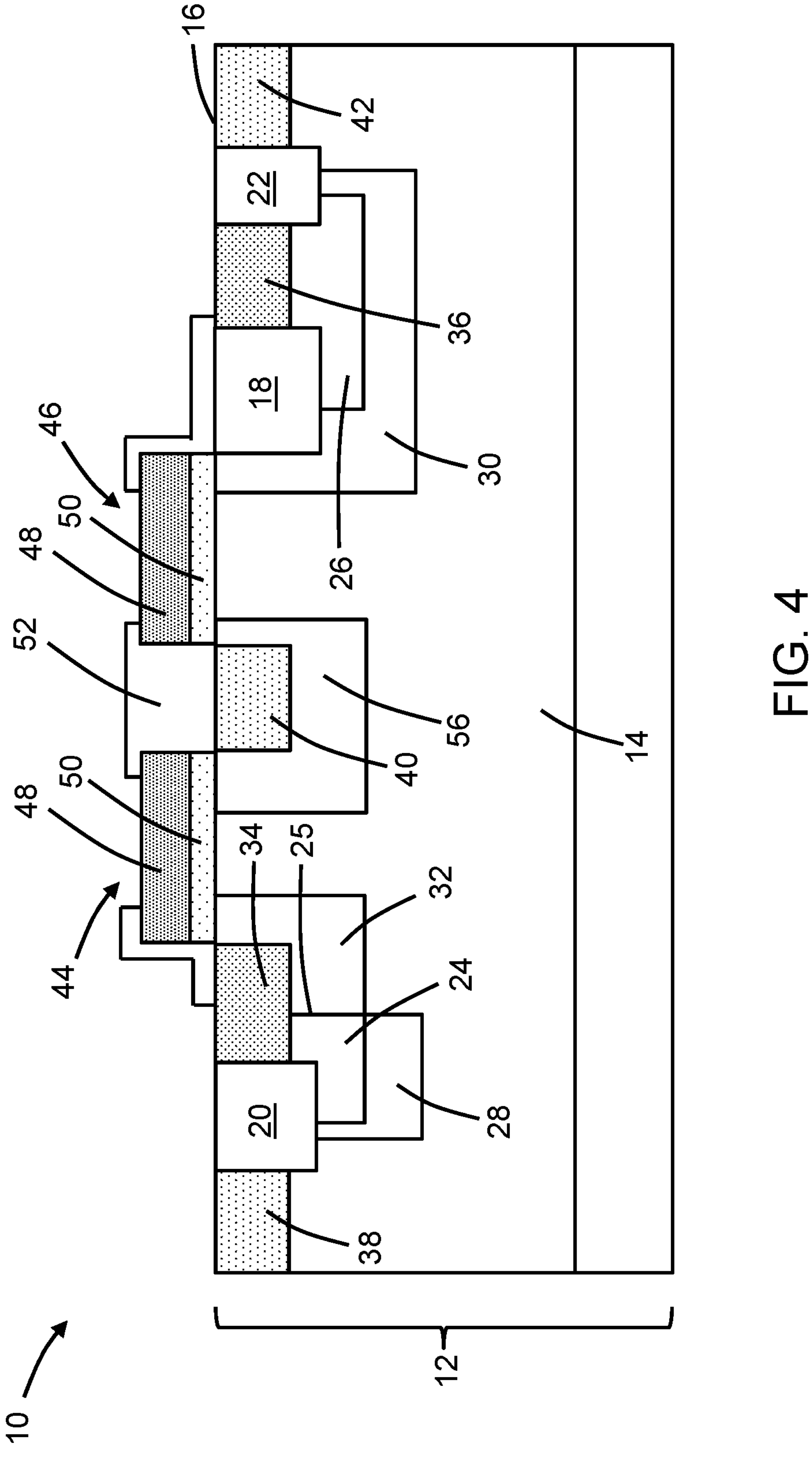
FIG. 4 is a cross-sectional view of a structure in accordance with alternative embodiments of the invention.

With reference to FIG. 4 in which like reference numerals refer to like features in FIG. 3 and in accordance with alternative embodiments of the invention, the device structure 10 may be modified to add a shallow trench isolation region 18 that is disposed in a lateral direction between the gate 46 and the doped region 36 of the drain. The shallow trench isolation region 18 may be formed concurrently with the shallow trench isolation regions 20, 22, and the shallow trench isolation region 18 may be coplanar with the top surface 16. The shallow trench isolation region 18 may increase the electrical isolation between the doped region 36 of the drain and the gate 46 that is adjacent to the doped region 36.

Figure 5:
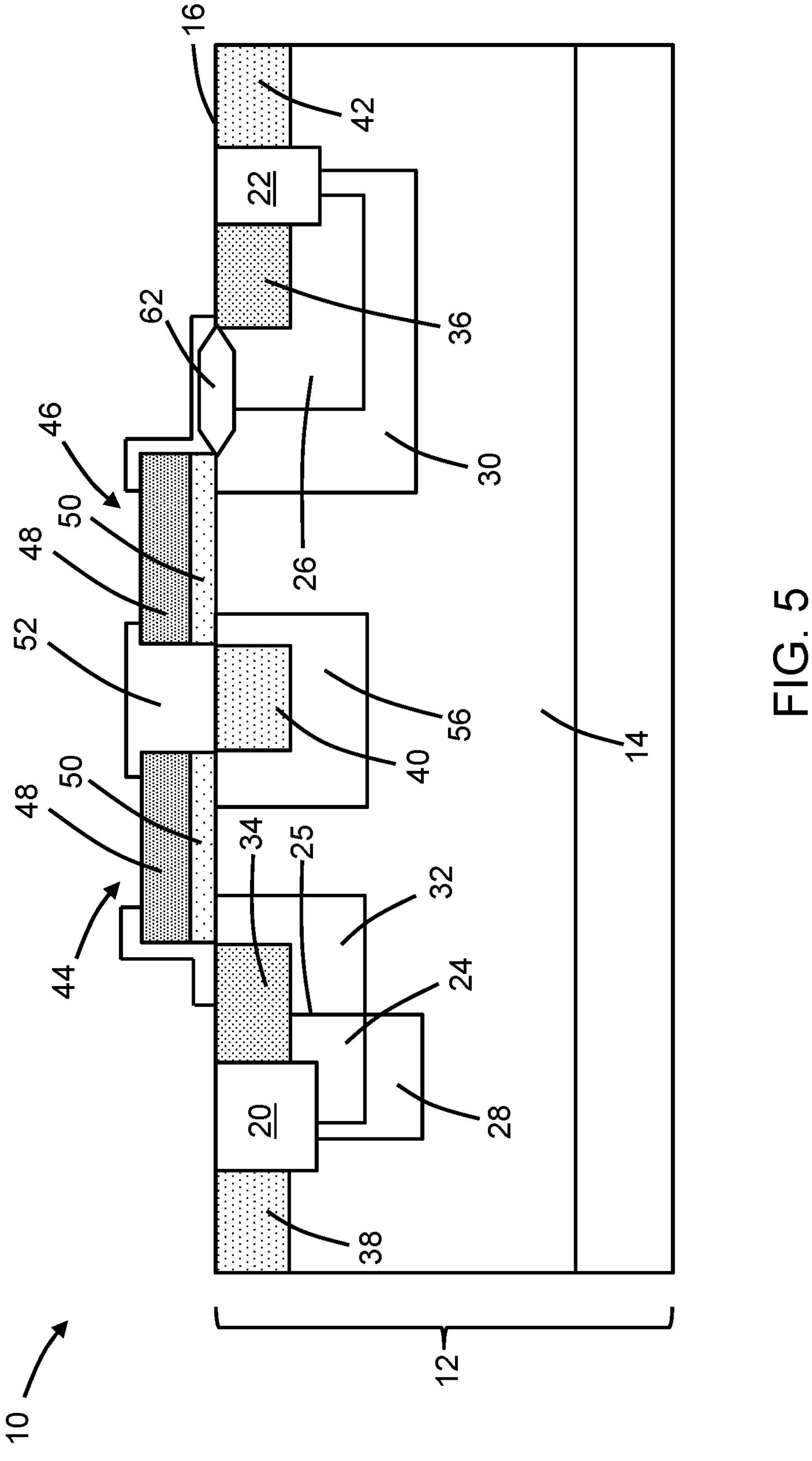
FIG. 5 is a cross-sectional view of a structure in accordance with alternative embodiments of the invention.

With reference to FIG. 5 in which like reference numerals refer to like features in FIG. 3 and in accordance with alternative embodiments of the invention, the device structure 10 may be modified to add a dielectric region 62 that is positioned at the top surface 16 of the semiconductor substrate 12. The dielectric region 62 may include a portion that is embedded in the semiconductor substrate 12 and a portion that projects above the top surface 16 of the semiconductor substrate 12. In an embodiment, the dielectric region 62 may be comprised of a dielectric material, such as silicon dioxide, that is an electrical insulator. In an embodiment, the dielectric region 62 may be formed as a field oxide by forming a patterned hardmask and subjecting a portion of the semiconductor substrate 12 exposed by the patterned hardmask to thermal oxidation in an oxidizing atmosphere (e.g., an atmosphere with an oxygen content) using a local oxidation of silicon (LOCOS) process. The oxidizing species (e.g., oxygen) is prevented from diffusing through the thickness of the hardmask during thermal oxidation, the portion of the semiconductor substrate 12 exposed by the opening in the hardmask is thermally oxidized to grow the dielectric region 62, and the hardmask is removed following the formation of the dielectric region 62. The dielectric region 62 may increase the electrical isolation between the doped region 36 of the drain and the gate 46 that is adjacent to the doped region 36.

Figure 6:
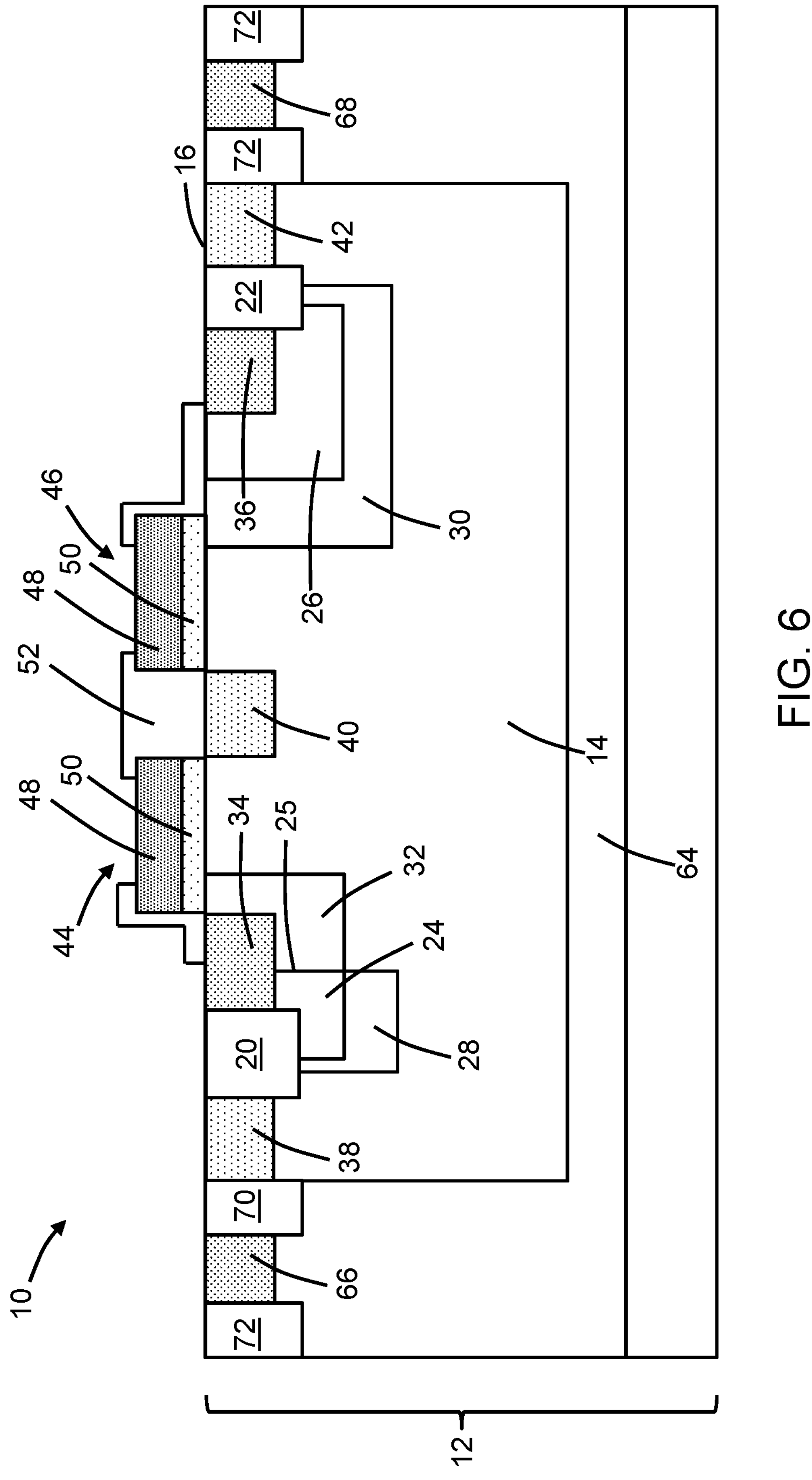
FIG. 6 is a cross-sectional view of a structure in accordance with alternative embodiments of the invention.

With reference to FIG. 6 in which like reference numerals refer to like features in FIG. 1 and in accordance with alternative embodiments of the invention, the device structure 10 may be modified to add a deep well 64 that surrounds the high-voltage well 14, doped regions 66, 68 that are coupled to the deep well 64, a shallow trench isolation region 70 that is disposed in a lateral direction between the doped region 38 and the doped region 66, and a shallow trench isolation region 72 that is disposed in a lateral direction between the doped region 42 and the doped region 68. The shallow trench isolation regions 70, 72 may be formed concurrently with the shallow trench isolation regions 20, 22. The high-voltage well 14 may have side edges that are aligned with side edges of the shallow trench isolation regions 70, 72. In an alternative embodiment, the shallow trench isolation regions 70, 72 may overlap with the side edges of the high-voltage well 14. The deep well 64 may be doped to have an opposite conductivity type from the high-voltage well 14 and may be lightly doped. The deep well 64 may provide substrate isolation that permits deployment of the device structure 10 in a higher voltage application in comparison with the device structure 10 including only the high-voltage well 14.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate a range of +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction in the frame of reference perpendicular to the horizontal, as just defined. The term "lateral" refers to a direction in the frame of reference within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features may "overlap" if a feature extends over, and covers a part of, another feature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for an electrostatic discharge protection device, the structure comprising:

a semiconductor substrate;

a first shallow trench isolation region in the semiconductor substrate;

a first gate over the semiconductor substrate;

a second gate over the semiconductor substrate, the second gate adjacent to the first gate;

a source adjacent to the first gate, the source including a first well in the semiconductor substrate, a second well in the semiconductor substrate, a third well in the semiconductor substrate, and a first doped region, the first well and the first doped region having a first conductivity type, the second well having a second conductivity type opposite from the first conductivity type, the third well having the first conductivity type at a lower dopant concentration than the first well, the first well disposed between the third well and the first doped region, the first well having a corner that is disposed beneath the first shallow trench isolation region, the third well including a portion beneath the first well, the third well wrapping about the corner of the first well, the first doped region having a first portion that overlaps with the first well, and the first doped region having a second portion that overlaps with the second well; and a drain adjacent to the second gate, wherein the first gate and the second gate are laterally between the source and the drain.

2. The structure of claim 1 wherein the first conductivity type is n-type, and the second conductivity type is p-type.

3. The structure of claim 1 wherein the first well and the second well adjoin at an interface, and the first doped region overlaps with the interface.

4. The structure of claim 3 wherein the first portion of the first doped region adjoins the first well on one side of the interface, and the second portion of the first doped region adjoins the second well on an opposite side of the interface.

5. The structure of claim 1 further comprising:

a first terminal, wherein the first gate, the second gate, and the source are coupled to the first terminal.

6. The structure of claim 5 further comprising:

a second terminal, wherein the drain is coupled to the second terminal.

7. The structure of claim 6 wherein the first terminal is configured to tie the first gate, the second gate, and the source to ground, and the second terminal is an input/output terminal.

8. The structure of claim 1 wherein the drain includes a doped region, and further comprising:

a second shallow trench isolation region disposed laterally between the doped region of the drain and the second gate.

9. The structure of claim 1 wherein the semiconductor substrate has a top surface, the drain includes a doped region adjacent to the top surface, and further comprising:

a dielectric region disposed laterally between the doped region of the drain and the second gate, the dielectric region including a first portion above the top surface and a second portion below the top surface.

10. The structure of claim 1 wherein the semiconductor substrate has a top surface, the drain includes a doped region, a first well in the semiconductor substrate, and a second well in the semiconductor substrate, the doped region of the drain is disposed adjacent to the top surface, and the first well of the drain is disposed between the doped region of the drain and the second well of the drain.

11. The structure of claim 10 wherein the doped region of the drain has the first conductivity type, the first well of the drain has the first conductivity type at a lower dopant concentration than the doped region of the drain, and the second well of the drain has the first conductivity type at a lower dopant concentration than the first well of the drain.

12. The structure of claim 1 further comprising:

a second doped region in the semiconductor substrate, the second doped region having the second conductivity type, and the second doped region positioned in a lateral direction between the first gate and the second gate.

13. The structure of claim 12 further comprising:

a silicide-blocking layer extending from the first gate to the second gate, the silicide-blocking layer disposed over the second doped region, and the silicide-blocking layer comprising a dielectric material.

14. The structure of claim 13 wherein the dielectric material of the silicide blocking layer fully overlaps with the second doped region such that the second doped region is electrically floating.

15. The structure of claim 13 wherein the first gate and the second gate each include a gate conductor layer and a gate dielectric layer, and the gate dielectric layer comprises a material different than the dielectric material of the silicide-blocking layer.

16. The structure of claim 12 further comprising:

a fourth well in the semiconductor substrate, the fourth well having the second conductivity type at a lower dopant concentration than the second doped region, and the fourth well surrounding the second doped region.

17. The structure of claim 1 further comprising:

a fourth well in the semiconductor substrate, the fourth well having the second conductivity type at a lower dopant concentration than the second well, wherein the fourth well is wrapped about a corner of the second well, the first gate overlaps with a portion of the second well, the first gate overlaps with a first portion of the fourth well, and the second gate overlaps with a second portion of the fourth well.

18. The structure of claim 1 wherein the first gate is disposed over a portion of the second well.

19. The structure of claim 17 further comprising:

a second doped region in the semiconductor substrate, the second doped region having the second conductivity type, and the second doped region positioned in a lateral direction between the first gate and the second gate; and a dielectric layer extending from the first gate to the second gate, the dielectric layer fully overlapping with the second doped region such that the second doped region is electrically floating.

20. A method of forming a structure for an electrostatic discharge protection device, the method comprising:

forming a first gate over a semiconductor substrate;

forming a shallow trench isolation region in the semiconductor substrate;

forming a second gate over the semiconductor substrate, wherein the second gate is disposed adjacent to the first gate;

forming a source adjacent to the first gate, wherein the source includes a first well in the semiconductor substrate, a second well in the semiconductor substrate, a third well in the semiconductor substrate, and a first doped region, the first well and the first doped region have a first conductivity type, the second well has a second conductivity type opposite from the first conductivity type, the third well has the first conductivity type at a lower dopant concentration than the first well, the first well is disposed between the third well and the first doped region, the first well has a corner that is disposed beneath the shallow trench isolation region, the third well includes a portion beneath the first well, the third well wrapping about the corner of the first well, the first doped region has a first portion that overlaps with the first well, and the first doped region has a second portion that overlaps with the second well; and forming a drain adjacent to the second gate, wherein the first gate and the second gate are laterally between the source and the drain.

* * * * *